United States Patent
Leewis et al.

(10) Patent No.: US 8,848,195 B2
(45) Date of Patent: Sep. 30, 2014

(54) INSPECTION METHOD AND APPARATUS, LITHOGRAPHIC APPARATUS, LITHOGRAPHIC PROCESSING CELL AND DEVICE MANUFACTURING METHOD FOR DETERMINING A PROPERTY OF A SUBSTRATE

(75) Inventors: Christian Marinus Leewis, Maastricht (NL); Marcus Adrianus Van De Kerkhof, Helmond (NL); Karel Diederick Van Der Mast, Helmond (NL); Peter Clement Paul Vanoppen, Hechtel-Ekse (BE); Ruben Alvarez Sanchez, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 437 days.

(21) Appl. No.: 13/123,613

(22) PCT Filed: Oct. 22, 2009

(86) PCT No.: PCT/EP2009/063918
§ 371 (c)(1),
(2), (4) Date: Oct. 24, 2011

(87) PCT Pub. No.: WO2010/049348
PCT Pub. Date: May 6, 2010

(65) Prior Publication Data
US 2012/0033223 A1    Feb. 9, 2012

Related U.S. Application Data

(60) Provisional application No. 61/110,167, filed on Oct. 31, 2008.

(51) Int. Cl.
*G01N 21/47*    (2006.01)
*G03F 7/20*    (2006.01)

(52) U.S. Cl.
CPC ............... *G03F 7/70625* (2013.01)
USPC .............................................. 356/446

(58) Field of Classification Search
USPC .............................................. 356/446
See application file for complete search history.

(56) References Cited

U.S. PATENT DOCUMENTS

| | | | |
|---|---|---|---|
| 2004/0070772 A1 | 4/2004 | Shchegrov et al. | |
| 2007/0052948 A1* | 3/2007 | Den Boef et al. | 356/124 |
| 2008/0009081 A1 | 1/2008 | Madriaga et al. | |
| 2008/0106729 A1 | 5/2008 | Vuong et al. | |
| 2008/0279442 A1* | 11/2008 | Den Boef et al. | 382/144 |

FOREIGN PATENT DOCUMENTS

EP    1 628 164 A2    2/2006

OTHER PUBLICATIONS

International Search Report directed to related International Patent Application No. PCT/EP2009/063918, from The European Patent Office, Rijswijk, The Netherlands, mailed Feb. 1, 2011; 3 pages.
International Preliminary Report on Patentability and Written Opinion directed to related International Patent Application No. PCT/EP2009/063918, from The International Bureau of WIPO, Geneva, Switzerland, mailed May 12, 2011; 6 pages.

* cited by examiner

*Primary Examiner* — Tarifur Chowdhury
*Assistant Examiner* — Omar Nixon
(74) *Attorney, Agent, or Firm* — Sterne, Kessler, Goldstein & Fox P.L.L.C.

(57) ABSTRACT

In a method for determining one or more properties of a substrate, scatterometry spectra can be measured from one or more targets on the substrate. Reconstructions of each of said spectra can be performed to derive one or more values for the property of the substrate, by comparing representations of each of the measured spectra with one or more modeled representations of spectra calculated using variable parameter values. At least one parameter in the reconstruction for each spectrum can be linked to the value of the parameter used in the reconstruction for a different spectrum.

24 Claims, 6 Drawing Sheets

Fig. 10

INSPECTION METHOD AND APPARATUS, LITHOGRAPHIC APPARATUS, LITHOGRAPHIC PROCESSING CELL AND DEVICE MANUFACTURING METHOD FOR DETERMINING A PROPERTY OF A SUBSTRATE

CROSS-REFERENCE TO RELATED APPLICATIONS

This application claims the benefit of U.S. provisional application 61/110,167, which was filed on Oct. 31, 2008, and which is incorporated herein in its entirety by reference.

FIELD

Embodiments of the present invention relate to methods of inspection that can be used, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a "mask" or a "reticle," may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (e.g., resist) provided on the substrate. In general, a single substrate will contain a network of adjacent target portions that are successively patterned. Known lithographic apparatus include so-called "steppers," in which each target portion is irradiated by exposing an entire pattern onto the target portion at one time, and so-called "scanners," in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to monitor the lithographic process, it is desirable to measure parameters of the patterned substrate such as, for example, an overlay error between successive layers formed in or on the substrate. There are various techniques for making measurements of the microscopic structures formed in lithographic processes, including the use of scanning electron microscopes and various specialized tools. One form of a specialized inspection tool is a scatterometer in which a beam of radiation is directed onto a target in or on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known—spectroscopic scatterometer and angularly-resolved scatterometer. Spectroscopic scatterometers direct a broadband radiation beam onto the substrate and measure the spectrum (e.g., intensity as a function of wavelength) of the radiation scattered into a particular narrow angular range. Angularly-resolved scatterometers use a monochromatic radiation beam and measure the intensity of the scattered radiation as a function of angle. Another type of scatterometer, which may be used, is ellipsometric.

As substrates have a significant number of properties that contribute to the spectrum measured by the scatterometer, image processing to determine attributes of the properties can be complex.

SUMMARY

It is desirable to provide a method for measuring a property of a substrate with efficient processing of the spectrum measured by an inspection apparatus.

According to an embodiment of the present invention, there is provided a method for determining at least one property of a substrate. The method includes the following: measuring a plurality of scatterometry spectra from one or more targets on said substrate; and performing reconstructions of each of said spectra to derive one or more values for said property by comparing representations of each of said measured spectra with one or more modeled representations of spectra calculated using variable parameter values, where at least one parameter in the reconstruction for each spectrum is linked to the value of the parameter used in the reconstruction for a different spectrum.

According to another embodiment of the invention, there is provided an inspection apparatus configured to determine at least one property of a substrate. The apparatus includes the following: a scatterometer configured to measure a plurality of scatterometry spectra from one or more targets on said substrate; and a processing arrangement configured to perform reconstructions of each of said spectra to derive one or more values for said property by comparing representations of each of said measured spectra with one or more modeled representations of spectra calculated using variable parameter values, where at least one parameter in the reconstruction for each spectrum is linked to the value of the parameter used in the reconstruction for a different spectrum.

According to yet another embodiment of the present invention, there is provided a device manufacturing method, which includes the following: using a lithographic apparatus to form a pattern on a substrate; and determining a value related to a parameter of the pattern printed. The determination of the value related to the parameter of the pattern printed includes the following: measuring scatterometry spectra from one or more targets on said substrate; and performing reconstructions of each of said spectra to derive one or more values for said property by comparing representations of each of said measured spectra with one or more modeled representations of spectra calculated using variable parameter values, where at least one parameter in the reconstruction for each spectrum is linked to the value of the parameter used in the reconstruction for a different spectrum.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 8(a)-(g) illustrate process steps for forming a structure on a substrate which may be inspected using an inspection method in accordance with an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
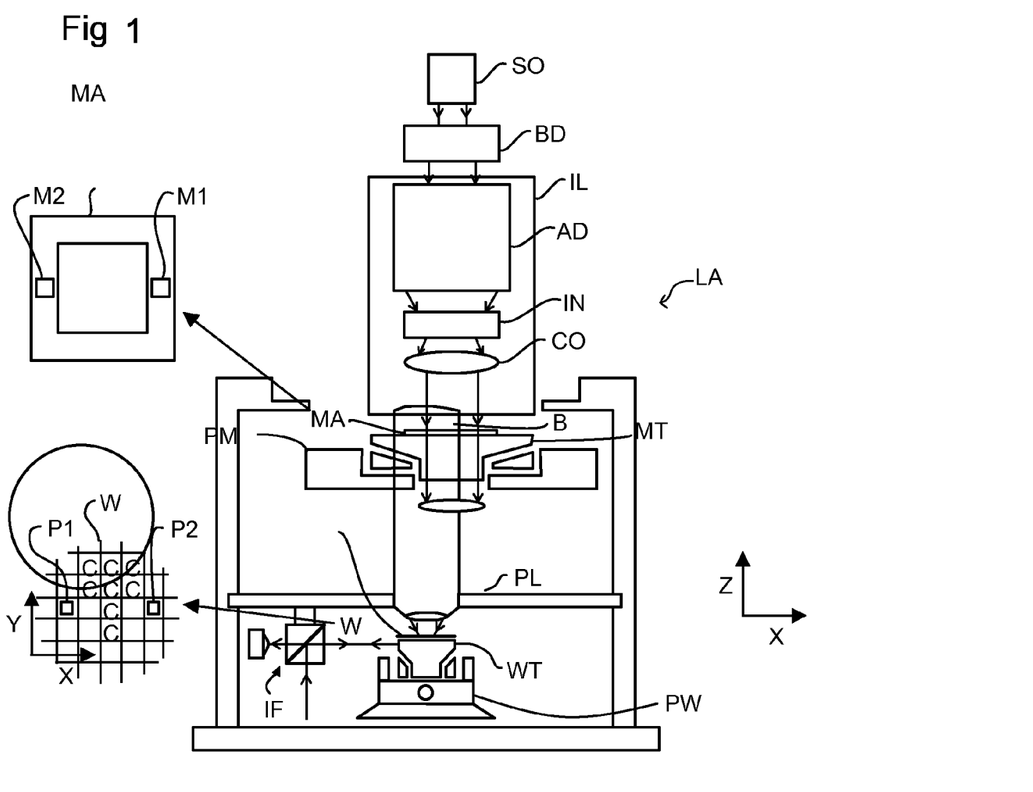
FIG. 1 depicts a lithographic apparatus in which embodiments of the present invention may be implemented.

FIG. 1 schematically depicts a lithographic apparatus in which embodiments of the present invention may be implemented. The apparatus includes the following: an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) W and connected to a second positioner PW configured to accurately position the substrate in accordance with certain parameters; and, a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports (i.e., bears the weight of) the patterning device. It holds the patterning device in a manner that depends on the orientation of the patterning device, the design of the lithographic apparatus, and other conditions such as, for example, whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example, with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example, if the pattern includes phase-shifting features or so called "assist features." Generally, the pattern imparted to the radiation beam will correspond to a particular functional layer in a device being created in the target portion, such as, for example, an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in a different direction. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As depicted herein, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (i.e., dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index (e.g., water) so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities such as, for example, when the source is an excimer laser. In such cases, the source is not considered to form part of the lithographic apparatus and the radiation beam is passed from the source SO to the illuminator IL with the aid of a beam delivery system BD that includes, for example, suitable directing mirrors and/or a beam expander. In other cases the source may be an integral part of the lithographic apparatus, for example, when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL may include various other components such as, for example, an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder, or capacitive sensor), the substrate table WT can be moved accurately (e.g., so as to position different target portions C in the path of the radiation beam B). Similarly, the first positioner PM and another position sensor (which is not explicitly depicted in FIG. 1) can be used to accurately position the mask MA with respect to the path of the radiation beam B (e.g., after mechanical retrieval from a mask library or during a scan). In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1 and M2 and substrate alignment marks P1 and P2. Although the substrate alignment marks as illustrated occupy dedicated target portions, they may be located in spaces between target portions (these are known as "scribe-lane" alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the x- and/or y-direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-) magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
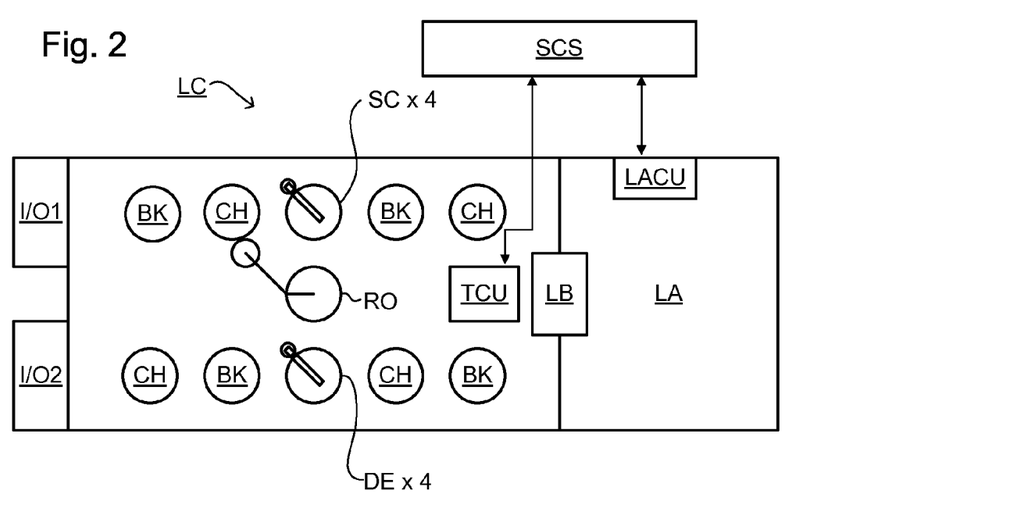
FIG. 2 depicts a lithographic cell or cluster in which embodiments of the present invention may be implemented.

As shown in FIG. 2, the lithographic apparatus LA forms part of a lithographic cell LC, also sometimes referred to a "lithocell" or "cluster," which also includes apparatus to perform pre- and post-exposure processes on a substrate. Conventionally, these lithocells include spin coaters SC to deposit resist layers, developers DE to develop exposed resist, chill plates CH, and bake plates BK. A substrate handler, or robot RO, picks up substrates from input/output ports I/O1 and I/O2, moves the substrates between the different process apparatus, and delivers the substrates to the loading bay LB of the lithographic apparatus. These devices, which are often collectively referred to as a "track," are under the control of a track control unit TCU which is itself controlled by the supervisory control system SCS, which also controls the lithographic apparatus via lithography control unit LACU. Thus, the different apparatus can be operated to maximize throughput and processing efficiency.

In order to ensure that the substrates exposed by the lithographic apparatus are exposed correctly and consistently, it is desirable to inspect exposed substrates to measure properties such as, for example, overlay errors between subsequent layers, line thicknesses, and critical dimensions (CD). If errors are detected, adjustments may be made to exposures of subsequent substrates, especially if the inspection can be done prior to other substrates of the same batch are exposed. Also, already exposed substrates may be stripped and reworked (e.g., to improve yield or discard), thereby avoiding an exposure process on substrates that are known to be faulty. In a case where only some target portions of a substrate are faulty, further exposures can be performed only on those target portions which are considered good.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable rapid measurements, it is desirable that the inspection apparatus measures properties in the exposed resist layer immediately after the exposure. However, a latent image in the resist has a very low contrast (i.e., there is only a very small difference in refractive index between the parts of the resist which have been exposed to radiation and those which have not) and not all inspection apparatus have sufficient sensitivity to make useful measurements of the latent image. Therefore, measurements may be taken after the post-exposure bake step (PEB), which is customarily the first step carried out on exposed substrates and increases the contrast between exposed and unexposed parts of the resist. At this stage, the image in the resist may be referred to as "semi-latent." It is also possible to make measurements of the developed resist image (at which point either the exposed or unexposed parts of the resist have been removed) or after a pattern transfer step such as etching. The latter possibility limits the possibilities for rework of faulty substrates but may still provide useful information.

Figure 3:
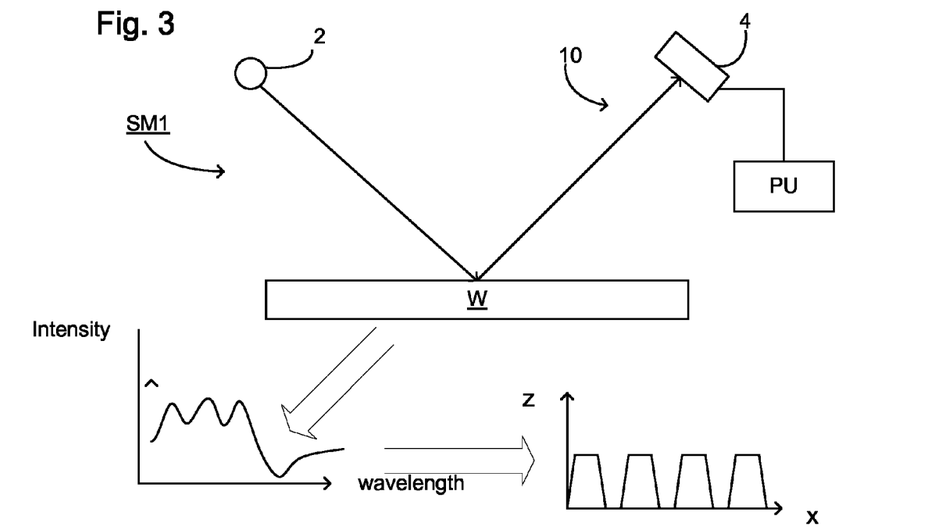
FIG. 3 depicts a first scatterometer in which embodiments of the present invention may be implemented.

FIG. 3 depicts a scatterometer SM1 which may be used with embodiments of the present invention. Scatterometer SM1 includes a broadband (white light) radiation projector 2 that projects radiation onto a substrate W. The reflected radiation is passed to a spectrometer detector 4, which measures a spectrum 10 (intensity as a function of wavelength) of the specular reflected radiation. From this data, the structure or profile giving rise to the detected spectrum may be reconstructed by processing unit PU (e.g., by Rigorous Coupled Wave Analysis and non-linear regression or by comparison with a library of simulated spectra as shown at the bottom of FIG. 3). In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
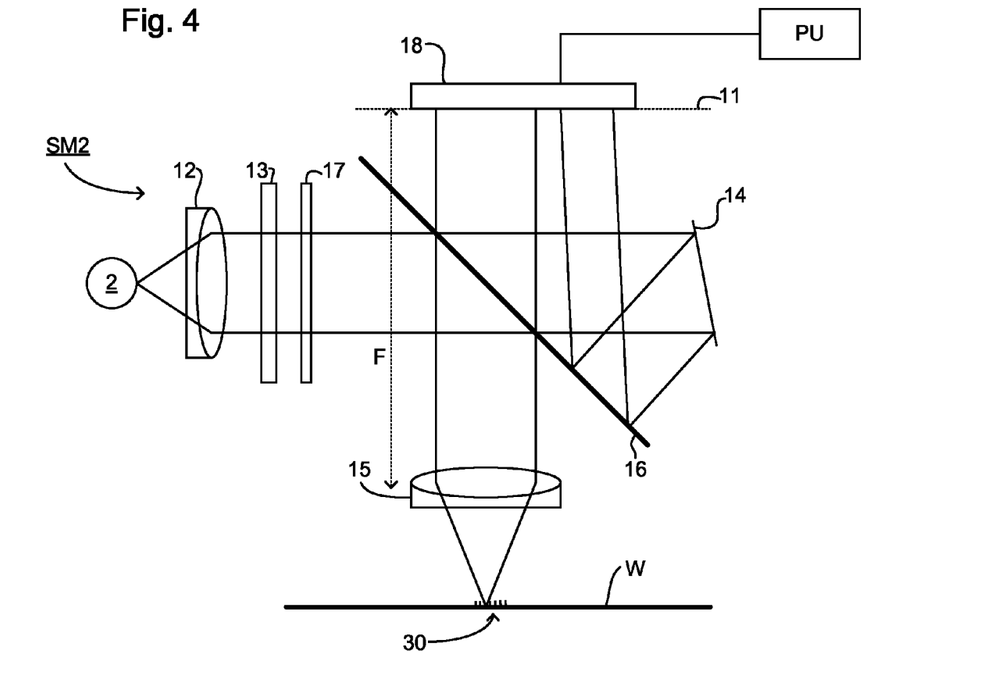
FIG. 4 depicts a second scatterometer in which embodiments of the present invention may be implemented.

Another scatterometer SM2 that may be used with embodiments of the present invention is shown in FIG. 4. In this device, the radiation emitted by radiation source 2 is focused using lens system 12 through interference filter 13 and polarizer 17, is reflected by partially reflective surface 16, and is focused onto substrate W via a microscope objective lens 15, which has a high numerical aperture (NA) (e.g., at least 0.9 or at least 0.95). Immersion scatterometers may have, for example, lenses with numerical apertures over 1. The reflected radiation then transmits through partially reflective surface 16 into a detector 18 in order to have the scatter spectrum detected. The detector may be located in the back-projected pupil plane 11, which is at the focal length of the lens system 15; however, the pupil plane may instead be re-imaged with auxiliary optics (not shown) onto the detector. The pupil plane is the plane in which the radial position of radiation defines the angle of incidence and the angular position defines azimuth angle of the radiation. The detector may be a two-dimensional detector so that a two-dimensional angular scattered spectrum of a substrate target 30 can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 16, part of the radiation beam is transmitted through the beam splitter as a reference beam towards a reference mirror 14. The reference beam is then projected onto a different part of the same detector 18.

A set of interference filters 13 is available to select a wavelength of interest in the range of, for example, about 405-790 nm or as low as, for example, about 200-300 nm. The interference filter may be tunable rather than including a set of different filters. A grating could be used instead of interference filters.

The detector 18 may measure the intensity of scattered light at a single wavelength (or narrow wavelength range), separately at multiple wavelengths, or integrated over a wavelength range. Furthermore, the detector may separately measure the intensity of transverse magnetic- and transverse electric-polarized light and/or the phase difference between the transverse magnetic- and transverse electric-polarized light.

Using a broadband light source (i.e., one with a wide range of light frequencies or wavelengths) is possible, which gives a large etendue, allowing the mixing of multiple wavelengths. The plurality of wavelengths in the broadband preferably each has a bandwidth of $\delta\lambda$ and a spacing of at least $2\delta\lambda$ (i.e., twice the bandwidth). Several "sources" of radiation can be different portions of an extended radiation source which have been split using fiber bundles. In this way, angle-resolved scattered spectra can be measured at multiple wavelengths in parallel. A 3-D spectrum (wavelength and two different angles) can be measured, which contains more information than a 2-D spectrum. This allows more information to be measured which increases metrology process robustness. This is described in more detail in EP1,628,164A, which is incorporated by reference herein in its entirety.

The target 30 on substrate W may be a grating, which is printed such that after development, the bars are formed of solid resist lines. The bars may alternatively be etched into the substrate. This pattern is sensitive to chromatic aberrations in the lithographic projection apparatus (particularly, the projection system PL) and illumination symmetry and the presence of such aberrations will manifest themselves in a variation in the printed grating. Accordingly, the scatterometry data of the printed gratings is used to reconstruct the gratings. The parameters of the grating, such as line widths and shapes, may be input to the reconstruction process, performed by processing unit PU from knowledge of the printing step and/or other scatterometry processes.

Figure 5:
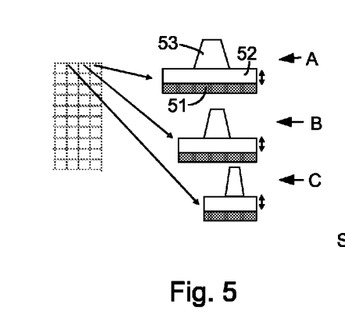
FIG. 5 depicts three targets on a substrate, to which an inspection method in accordance with an embodiment of the present invention may be applied.
Figure 6:
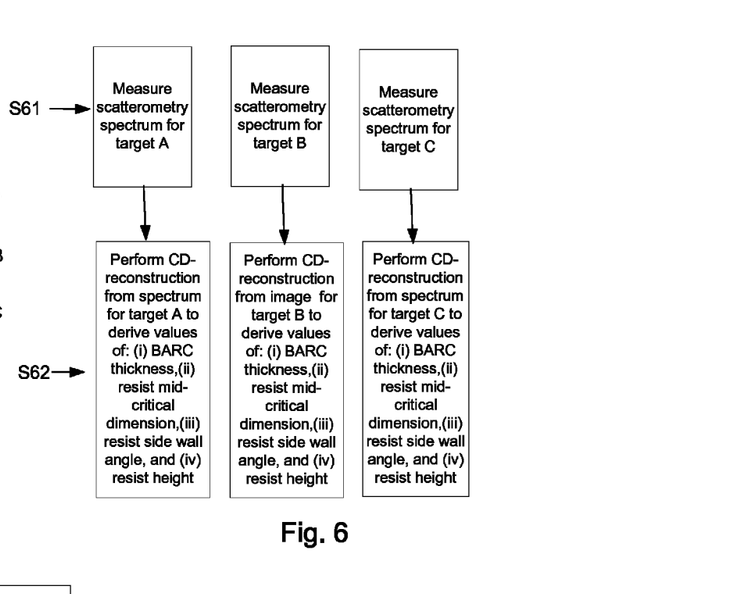
FIG. 6 illustrates an inspection method for processing the targets shown in FIG. 5.
Figure 7:
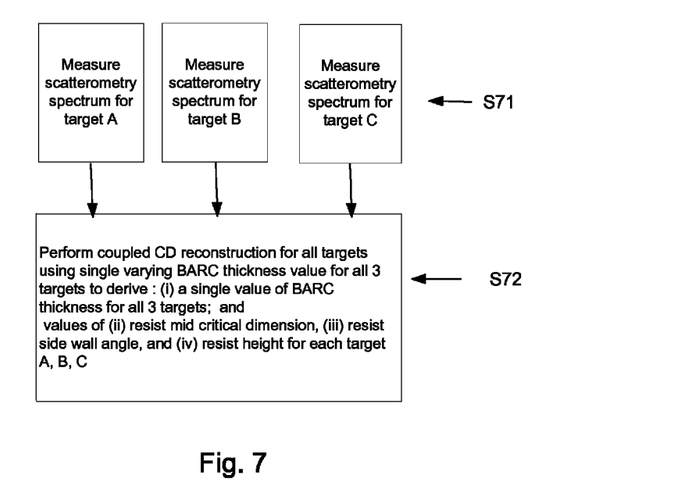
FIG. 7 illustrates a method in accordance with an embodiment of the present invention used to process scatterometry data from the targets shown in FIG. 5.

Referring to FIGS. 5-7, an embodiment of an inspection method in accordance with the present invention (to be described further below) is applied to a number of CD targets A, B, and C positioned adjacent to each other on a wafer. The targets A, B, and C have different characteristics from each other; in this particular example, targets A, B, and C have different pitches. In accordance with an embodiment of the present invention, the spectra produced by a scatterometer for each target are reconstructed simultaneously, while constraining parameters that correspond to each other for each of the targets to have the same value within the reconstruction processing.

In reference to FIG. 5, each target A, B, and C is formed on adjacent portions of a substrate 51 and includes a base and reflective coating (BARC) 52 formed on part of the substrate 51 and a resist structure 53 overlying the BARC 52. The structures targets A, B, and C differ from each other such that, in this example, they have three different pitches.

Turning now to FIG. 6, FIG. 6 illustrates a conventional inspection method in which a scatterometry spectrum is measured for each target A, B, and C. In step S61, CD-reconstruction is performed from each image of the spectrum for each of the three targets A, B, and C. In step S62, to derive values for each target, the following parameters are taken into consideration:

(1) BARC thickness;
(2) resist mid-critical dimension (MCD);
(3) resist sidewall angle (SWA); and,
(4) resist height for each target A, B, and C.

It will be appreciated by a person skilled in the relevant art that in a conventional method such as the method illustrated in FIG. 6, the separate CD-reconstruction for each target A, B, and C results in a total of 12 variables during processing. It will also be appreciated by a person skilled in the relevant art that the above-annotated parameters (1), (2), (3), and (4) in the list above are only examples of parameters whose values may be derived; in other words, there may be other parameters to be derived.

Turning to FIG. 7, FIG. 7 illustrates an inspection method in accordance with an embodiment of the present invention. As in step S61 of FIG. 6, a scatterometry spectrum is measured for each target A, B, and C in step S71 of FIG. 7. In accordance with this method, however, as the three targets originate from adjacent portions of the substrate 51 it can be assumed that there is not a large variation in the BARC thicknesses (indicated as double sided arrows in FIG. 5), for each target A, B, C. It is therefore possible to allocate a single value of the thickness of the BARC for all three targets. Instead of three separate BARC thicknesses, one BARC thickness is used for all three targets (i.e., one thickness value for each target A, B, and C), where the value of the BARC thickness may not be fixed and thus allowed to vary during the reconstruction processing.

The subsequent CD-reconstruction is then performed in a coupled manner for the three targets A, B, C in step S72 of FIG. 7. In particular, in an embodiment, the reconstructions take place simultaneously with the same varying BARC thickness value for all three targets A, B, and C, with the MCD, SWA, and resist heights for each target A, B, and C and one single BARC thickness for all three targets A, B, and C, varying in the reconstruction. It will be appreciated by a person skilled in the relevant art that, in this particular case, there will be a total of 10 variables in comparison to 12 variables in the method illustrated in FIG. 6, thus resulting in a decrease in the complexity of the reconstruction process.

It will be appreciated by a person skilled in the relevant art that this technique can be expanded to allow a number of corresponding parameters for each target to be kept identical to each other during the reconstruction process. As such, the computing time for the reconstructions can be decreased. Thus, scatterometry CD-reconstruction of relatively complicated targets, using available CD target information from similar simpler targets or thin film measurements can be made less complex. This has particular advantages, for instance, in a double patterning system including two or more overlay patterns, where a large set of floating parameters are required to describe the substrate. Embodiments of the present invention will also have applications in focus dose applications, as well as CD-reconstructions if focus and dose sensitive 2D targets are used that are difficult to reconstruct. For a combination of separate focus and dose sensitive targets, layer thicknesses can be coupled.

Figure 8:
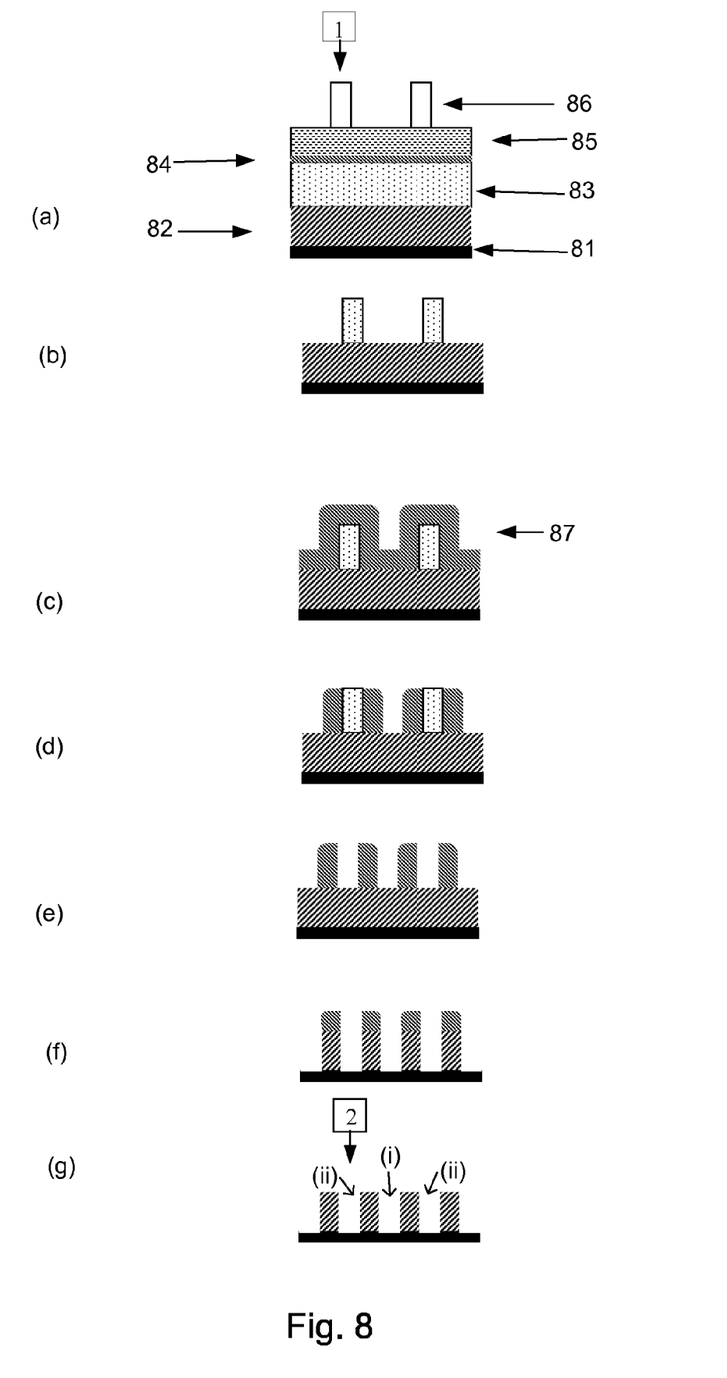
Figure 9:
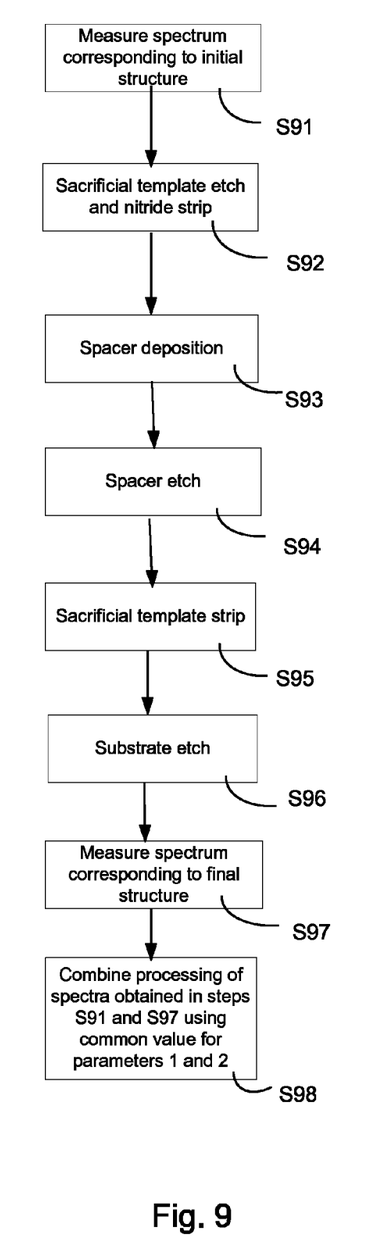
FIG. 9 depicts a method for producing the structure shown in FIG. 8 and the application of an inspection method in accordance with an embodiment of the present invention.

Turning to FIGS. 8 and 9, FIGS. 8 and 9 illustrate another embodiment in accordance with the present invention in which scatterometry spectra taken from different layers on a substrate may be reconstructed in a coupled manner.

In reference to FIG. 8, FIG. 8(a) illustrates a semiconductor structure comprising a substrate 81 on which is formed a poly Si layer 82. Over the poly Si layer 82, a layer of amorphous carbon 83 is formed. Over the layer of amorphous carbon 83, a nitride layer 84 is formed, over which a BARC layer 85 is formed. At the top of the structure, portions of resist 86 are formed, which define a required spacing in a subsequent spacer strip, which will subsequently be produced by removing portions of resist as shown in FIG. 8(g).

In reference to FIG. 9, upon formation of the structure shown in FIG. 8(a), a scatterometery spectrum is obtained of the structure, as indicated by spectrum measurement 1 in FIG. 8(a).

As indicated in step S92 of FIG. 9, following a sacrificial template etch and nitride strip, the structure shown in FIG. 8(b) is formed. In step S93, a spacer layer of Si nitride 87 is overlaid over the lithostructures 86 to produce the structure shown in FIG. 8(c). The structure illustrated in FIG. 8(c) is then etched in step S94 to produce the structure shown in FIG. 8(d).

In step S95, the remaining amorphous carbon 83 is stripped away and the sacrificial template stripped to leave the structure shown in FIG. 8(e).

In a subsequent substrate etch step of step S96, the poly Si layer 82 is etched to leave the structure shown in FIG. 8(f).

Finally the substrate is further etched to leave the spacer strip structure comprising poly Si, as shown in FIG. 8(g). In this layer there are four parameters of interest. These are the two line critical dimensions (CDs) and the two space widths of the spacer strip structure.

In accordance with an inspection method in accordance with and a second embodiment of the invention a further scatterometry spectrum is measured in step S97 at this point, that is spectrum measurement 2 denoted in FIG. 8(g). The processing of this spectrum is combined with the processing of the spectrum measured in step S91, using a common value for the critical dimension CD in spectrum 1 and one of the line spacings in spectrum 2.

The spacing widths in FIG. 8(g) are not identical and consist of two groups of spacing widths: (i) the central spacing width; and (ii) the left and right spacing widths of the structure shown in FIG. 8(g). The line width corresponding to the CD of the structure shown in FIG. 8(a) is used as values for spacing widths (ii) (i.e., the left and the right spacing widths in FIG. 8(g)). The other spacing width (i) (i.e., the central spacing width in FIG. 8(g)) is determined by the spacer layer 87 in FIG. 8(c) and has to be determined from the CD reconstruction of the spectra measurement 2 indicated in FIG. 8(g). It will be appreciated by a person skilled in the relevant art that, instead of having to determine the values of the two groups of spacing widths by CD reconstruction of the structure in FIG. 8(g), it is possible to use the CD of the structure of FIG. 8(a) for the width of one of the values. Since the two sets of spacing widths are hard to determine separately from just a single CD reconstruction of the structure in FIG. 8(g), this can reduce the complexity of the reconstruction process.

The substitution of the CD value of the structure of FIG. 8(a) into one of the spacing widths of the structure of FIG. 8(g) can be done in two ways. In an embodiment, one coupled CD reconstruction can be performed for both structures of FIG. 8(a) and FIG. 8(g). In another embodiment, a first CD reconstruction of the structure of FIG. 8(a) may be performed and the resulting value substituted in the second CD reconstruction from the second measurement indicated in FIG. 8(g).

Figure 10:
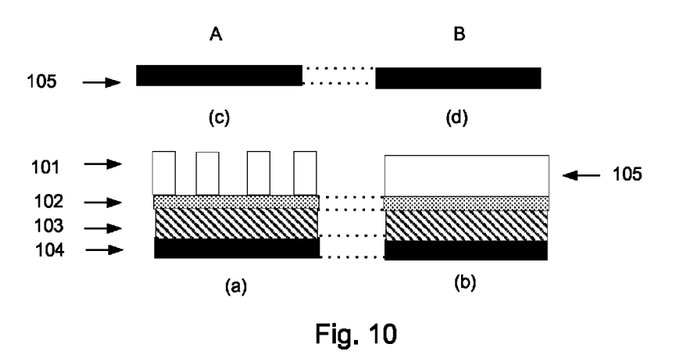
FIG. 10 illustrates four targets on a substrate for use in an inspection method in accordance with an embodiment of the present invention.
Figure 11:
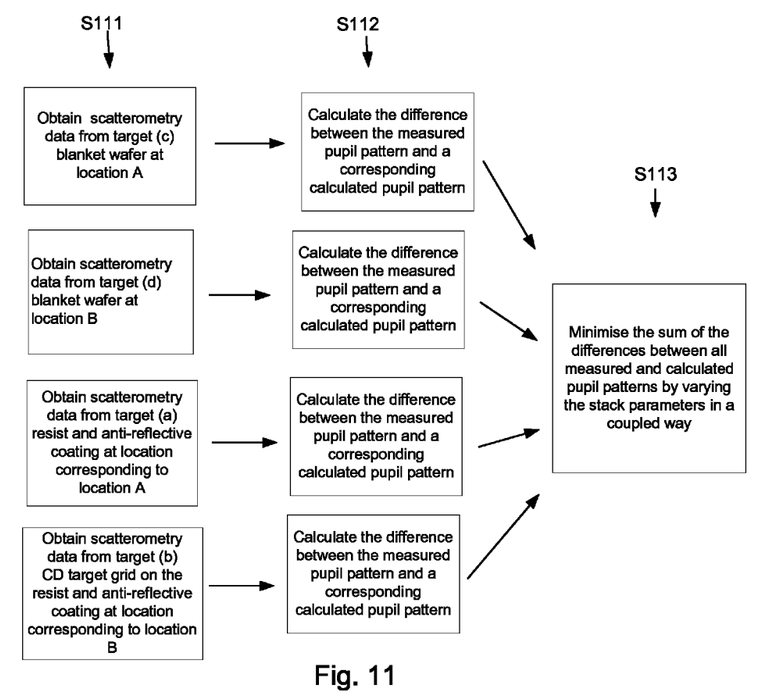
FIG. 11 illustrates an inspection method in accordance with an embodiment of the present invention.

Turning now to FIGS. 10 and 11, FIGS. 10 and 11 illustrate a third embodiment of an inspection method in accordance with the invention. In this embodiment scatterometry spectra measured before a grating is printed, are simultaneously reconstructed with scatterometry spectra measured after the grating has been printed.

Turning to FIG. 10, spectrometry data are obtained from four different targets. The first target (a) is a CD target grid 101 formed from resist, overlying a layer of BARC 102, overlying a product stack which is generally shown at 103 which is in turn formed on a wafer 104. The second target (b) comprises unpatterned resist 105 on overlying the BARC layer 102 on the same product stack 103 as the first target, at a position B close to position A on the wafer 104 at position A. The third and fourth targets (c) and (d) are on blanket wafers or wafers carrying another product stack (not shown), where these wafers 105 not carrying resist but the targets (c) and (d) being at positions corresponding to the positions A and B of the targets (a) and (b) on the wafers 104.

Turning to FIG. 11, in step S111, spectrometry data are obtained from each of the four targets (a), (b), (c), (d) described in relation to FIG. 10. The reconstruction of the spectra is performed by calculating differences between the measured spectra and the corresponding calculated spectra for each target in step S112. In step S113, the sums of the differences are minimized by varying the stack parameters in a coupled manner.

If the locations of the targets are the same between the layers, the stacked parameters can be coupled identically. If the stacks are similar, but not exactly the same, a small deviation between the parameters may be allowed.

It will be appreciated by a person skilled in the relevant art that by measurement of scatterometry spectra before the gratings are printed and after the grating is printed, with simultaneous reconstructions, a robust and accurate parameter estimation can be achieved.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (e.g., a tool that typically applies a layer of resist to a substrate and develops the exposed resist), a metrology tool, and/or an inspection tool. Where applicable, the disclosure herein may be applied to such and other substrate processing tools. Further, the substrate may be processed more than once, for example, in order to create a multi-layer IC, so that the term substrate used herein may also refer to a substrate that already contains multiple processed layers.

Although specific reference may have been made above to the use of embodiments of the present invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157, or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents

What is claimed is:

1. A method of determining a property of a substrate, comprising:
   independently measuring scatterometry spectra from corresponding targets on the substrate;
   linking a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
   deriving a value for the property based on the reconstruction of each of the measured scatterometry spectra.

2. The method of claim 1, further comprising:
   substantially simultaneously performing the reconstruction of each of the measured scatterometry spectra; and
   performing the reconstruction by comparing the measured scatterometry spectra with one or more modeled representations of spectra, modeled representations being calculated using the variable value.

3. The method of claim 1, wherein the linking further comprises:
   determining a value of the first variable parameter of the first one of the measured scatterometry spectra from a first target; and
   using the determined value the value for the corresponding second variable parameter of the second one of the measured scatterometry spectra from a second target.

4. The method of claim 1, wherein the corresponding targets are at different positions on the substrate.

5. The method of claim 1, further comprising:
   measuring the first one of the measured scatterometry spectra at a first lithography processing stage; and
   measuring the second one of the measured scatterometry spectra at a second lithography processing stage, the first lithography processing stage being at a different time than the second lithography processing stage;
   wherein the corresponding targets are at equivalent positions on the substrate.

6. The method of claim 1, further comprising:
   calculating differences between the measured scatterometry spectra and the model for each of the targets;
   calculating a sum of the differences; and
   minimizing the sum by varying the variable value.

7. The method of claim 1, wherein the variable parameter comprises at least one of a critical dimension and a line spacing.

8. An inspection apparatus configured to determine a property of a substrate, comprising:
   a scatterometer configured to measure scatterometry spectra from corresponding targets on the substrate; and
   a processing arrangement configured to:
      link a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
   derive a value for the property based on the reconstruction of each of the measured scatterometry spectra.

9. The inspection apparatus according to claim 8, wherein the processing arrangement is further configured to:
   perform the reconstruction of each of the measured scatterometry spectra substantially simultaneously; and
   perform the reconstruction by comparing the measured scatterometry spectra with one or more modeled representations of spectra, the modeled representations being calculated using the variable value.

10. The inspection apparatus according to claim 8, wherein the processing arrangement is further configured to:
    determine a value of the first variable parameter of the first one of the measured scatterometry spectra from a first target; and
    use the determined value as the value for the corresponding second variable parameter of the second one of the measured scatterometry spectra from a second target.

11. The inspection apparatus according to claim 8, wherein the scatterometer is further configured to:
    measure the first one of the measured scatterometry spectra at a first lithography processing stage; and
    measure the second one of the measured scatterometry spectra at a second lithography processing stage, the first lithography processing stage being at a different time than the second lithography processing stage;
    wherein the corresponding targets are at equivalent positions on the substrate.

12. A lithographic system comprising:
    a lithographic apparatus comprising:
    an illumination optical system arranged to illuminate a pattern;
    a projection optical system arranged to project an image of the pattern on to a substrate; and
    an inspection apparatus comprising:
       a scatterometer configured to measure scatterometry spectra from corresponding targets on the substrate; and
       a processing arrangement configured to:
          link a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and derive a value for a property of the substrate based on the reconstruction of each of the measured scatterometry spectra.

13. A lithographic cell comprising:
a coater arranged to coat substrates with a radiation sensitive layer;
a lithographic apparatus arranged to expose images onto the radiation sensitive layer of substrates coated by the coater;
a developer arranged to develop images exposed by the lithographic apparatus; and
an inspection apparatus comprising:
  a scatterometer configured to measure scatterometry spectra from corresponding targets on the substrate; and
  a processing arrangement configured to:
    link a variable value for a first variable parameter of a first one of the measured scatterometry spectra and for a second variable parameter of a second one of the measured scatterometry spectra to reduce a number of variable the parameters for a reconstruction of each of the measured scatterometry spectra; and
    derive a value for a property of the substrate based on the reconstruction of each of the measured scatterometry spectra.

14. A device manufacturing method comprising:
using a lithographic apparatus print a pattern on a substrate; and
determining a value related to a parameter of the printed pattern by:
  independently measuring scatterometry spectra from corresponding targets on the substrate;
  linking a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
  deriving the value related to the parameter based on the reconstruction of each of the measured scatterometry spectra.

15. An article of manufacture including a non-transitory computer-readable medium having instructions stored thereon, execution of which by a computing device cause the computing device to perform operations comprising:
  independently measuring scatterometry spectra from corresponding targets on a substrate;
  linking a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
  deriving a value for a property of the substrate based on the reconstruction of each of the measured scatterometry spectra.

16. An inspection apparatus configured to determine a property of a substrate, comprising:
  a scatterometer configured to measure scatterometry spectra from corresponding targets on the substrate; and
  a controller configured to:
    link a variable value for a first variable parameter of a first one of the measured scatterometry spectra and for a corresponding second variable parameter of a second one of the measured spectra to reduce a number of variable parameters for a reconstruction of each of the measured scatterometry spectra; and
    derive a value for the property based on the reconstruction of each of the measured scatterometry spectra.

17. The apparatus of claim 16, wherein the controller is configured to perform the reconstruction of each of the measured scatterometry spectra substantially simultaneously.

18. The apparatus of claim 16, wherein the controller is configured to:
  determine a value of the first variable parameter of the first one of the measured scatterometry spectra from a first target;
  use the determined value as a constant value for the corresponding second variable parameter of the second one of the measured scatterometry from a second target.

19. The apparatus of claim 16, wherein the scatterometer is configured to measure the scatterometry spectra from targets at different positions on the substrate.

20. The apparatus of claim 16, wherein the controller is configured to:
  determine differences between the measured scatterometry spectra and the model for each of the targets;
  calculate a sum of the differences; and
  minimize the sum of the differences by varying the variable value.

21. A lithographic system comprising:
a lithographic apparatus comprising:
  an illumination optical system configured to illuminate a pattern;
  a projection optical system configured to project an image of the pattern on to a substrate; and
  an inspection apparatus comprising:
    a scatterometer configured to measure scatterometry spectra from corresponding targets on the substrate; and
    a controller configured to:
      link a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
      derive a value for a property of the substrate based on the reconstruction of each of the measured scatterometry spectra.

22. A lithographic cell comprising:
a coater configured to coat substrates with a radiation sensitive layer;
a lithographic apparatus configured to expose images onto the radiation sensitive layer of substrates coated by the coater;
a developer configured to develop images exposed by the lithographic apparatus; and
an inspection apparatus comprising:
  a scatterometer configured to measure scatterometry spectra from corresponding targets on the substrate; and
  a controller configured to:
    link a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
    derive a value for a property of the substrate based on the reconstruction of each of the measured scatterometry spectra.

23. A device manufacturing method comprising:
  using a lithographic apparatus to form a pattern on a substrate; and
  determining a value related to a parameter of the formed pattern by:
    independently measuring scatterometry spectra from corresponding targets on the substrate;
    linking a variable value for a first variable parameter of a first one of the measured scatterometry spectra and for a corresponding second variable parameter of a second one of the measured scatterometry spectra to reduce a number of variable parameters for a reconstruction of each of the measured scatterometry spectra; and
    deriving the value related to the parameter based on the reconstruction of each of the measured scatterometry spectra.

24. A computer program embedded in a non-transitory machine readable medium and including machine executable instructions configured to execute a method for determining a property of a substrate, the method comprising:
  independently measuring scatterometry spectra from corresponding targets on the substrate;
  linking a variable value for a first variable parameter of first one of the measured scatterometry spectra and for a corresponding second variable parameter of a second one of the measured scatterometry spectra to reduce a number of variable parameters for a reconstruction of each of the measured scatterometry spectra; and
  deriving a value for the property based on the reconstruction of each of the measured scatterometry spectra.

* * * * *

UNITED STATES PATENT AND TRADEMARK OFFICE
CERTIFICATE OF CORRECTION

| | | |
|---|---|---|
| PATENT NO. | : 8,848,195 B2 | Page 1 of 1 |
| APPLICATION NO. | : 13/123613 | |
| DATED | : September 30, 2014 | |
| INVENTOR(S) | : Leewis et al. | |

It is certified that error appears in the above-identified patent and that said Letters Patent is hereby corrected as shown below:

In the Claims,

Column 13, line 46, Claim 2, after "spectra," please insert --the--.
Column 15, line 22, Claim 13, after "variable" please delete "the".
Column 17, line 24, Claim 24, after "parameter of" please insert --a--.

Signed and Sealed this
Eighteenth Day of August, 2015

Michelle K. Lee
*Director of the United States Patent and Trademark Office*